United States Patent
Dortu et al.

(10) Patent No.: US 6,229,364 B1
(45) Date of Patent: May 8, 2001

(54) FREQUENCY RANGE TRIMMING FOR A DELAY LINE

(75) Inventors: Jean-Marc Dortu, Munich (DE); Albert M. Chu, Essex; Christopher P. Miller, Underhill, both of VT (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/274,633

(22) Filed: Mar. 23, 1999

(51) Int. Cl.[7] ........................................... H03K 5/13
(52) U.S. Cl. ..................... 327/158; 327/161; 327/270; 327/276
(58) Field of Search ........................ 327/262, 272, 327/276, 277, 281, 269, 270, 271, 149, 152, 153, 158, 161

(56) References Cited

U.S. PATENT DOCUMENTS

| 5,306,971 | 4/1994 | McCune ............................ 307/603 |
| 5,428,309 | * 6/1995 | Yamauchi et al. ................. 327/158 |
| 5,636,254 | 6/1997 | Hase ................................... 375/371 |
| 5,644,261 | * 7/1997 | Frisch et al. ..................... 327/277 |
| 5,646,564 | 7/1997 | Erickson .......................... 327/158 |
| 5,684,421 | 11/1997 | Chapman ............................ 327/261 |
| 5,764,092 | 6/1998 | Wada .................................. 327/271 |
| 5,781,055 | 7/1998 | Bhagwan ............................ 327/270 |
| 5,801,570 | * 9/1998 | Mizuno et al. .................... 327/362 |
| 5,883,534 | 3/1999 | Kondoh ............................ 327/156 |
| 5,994,938 | * 11/1999 | Lesmeister ....................... 327/277 |
| 6,028,462 | * 2/2000 | Kyles ................................ 327/269 |

FOREIGN PATENT DOCUMENTS

| 0390226A | 10/1990 | (EP) . |
| 0566375A1 | 10/1993 | (EP) . |
| 63-69315 | * 3/1988 | (JP) ................................ 327/277 |
| 4-213213 | * 8/1992 | (JP) ................................ 327/277 |
| 6-125252 | * 5/1994 | (JP) ................................ 327/263 |

* cited by examiner

Primary Examiner—Tuan T. Lam
(74) Attorney, Agent, or Firm—Stanton Braden (57) ABSTRACT

A delay line, in accordance with the invention, includes a plurality of delay elements connecting an input and an output, the delay elements for causing a delay to be introduced to a signal passing through the delay elements. A voltage device is included for regulating power to the plurality of delay elements, the voltage device being adjustable to provide at least one predetermined voltage to the delay elements such that the delay in the delay elements is modified according to the predetermined voltage(s). The delay line may be employed in a delay locked loop, a clock circuit or other circuits.

24 Claims, 10 Drawing Sheets

Delay Line Delay vs. Vdd

FREQUENCY RANGE TRIMMING FOR A DELAY LINE

BACKGROUND

1. Technical Field

This disclosure relates to delay circuitry and more particularly, to an apparatus for trimming a frequency range for a data path using delay locked loop circuits which may be employed with down sort capability.

2. Description of the Related Art

Figure 1:
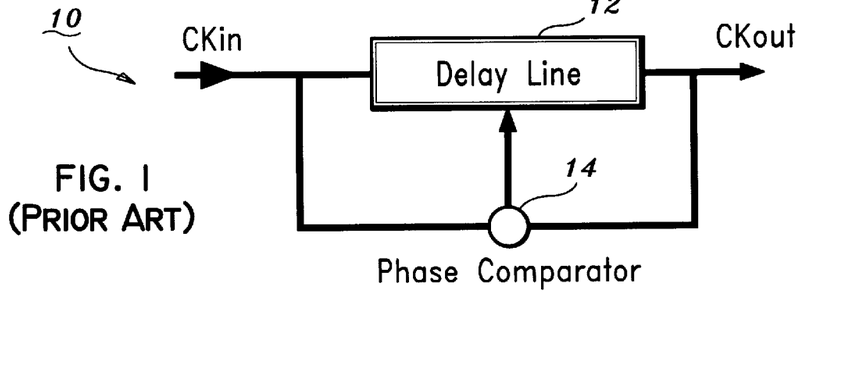
FIG. 1 is a schematic diagram of a prior art delay locked loop.

Delay locked loops (DLL) are employed to compare a periodic signal input signal with an output signal. In this way a phase difference between the signals can be set to about zero. Referring to FIG. 1, a conventional DLL 10 is shown. An input signal CKin is input to a delay line 12 and a phase comparator 14. An output signal CKout is compared with input signal CKin by employing phase comparator 14. Phase comparator 14 sets or adjusts delay line 12 to provide a zero phase difference between the input and output signals. Delay line 12 stabilizes when the delay between input CKin and output CKout signals reaches a clock period T or a multiple thereof (kT, where k is a natural number). DLL 10 may be employed to synchronize an input clock to an output clock on a given integrated circuit, for example.

Figure 2:
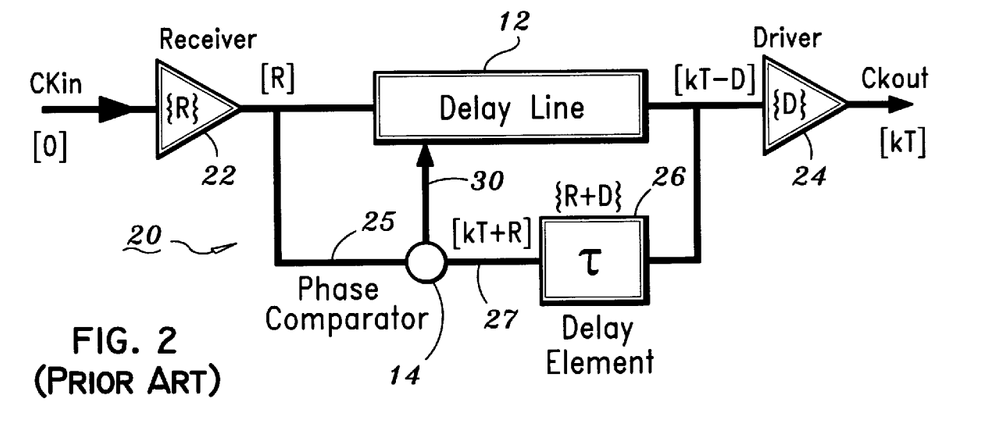
FIG. 2 is a schematic diagram of a prior art delay locked loop having a delay element representing delays introduced by circuit components.

Referring to FIG. 2, an application of a DLL is shown. DLL 20 includes delays introduced by a receiver 22 and by a driver 24. These delays are compensated for by a delay element 26. Delay element 26 provides a delay compensation of $\tau$ in a feedback loop where $\tau=R+D$. R is the delay introduced by receiver 22, and D is the delay introduced by driver 24. Input and output clocks, CKin and CKout, respectively, are synchronized when their phase difference becomes $2k\Pi$, that is, when the delay between input and output signals is equal to a multiple of the clock period, i.e., kT. Then, phase comparator 14 detects no phase difference between its two inputs 25 and 27. Input 25 has a delay of R compared to input clock (CKin). Input 27 has a delay of kT+R compared to input clock (CKin), where T is the clock period. In the case shown and described with respect to FIG. 2, the delay line control signal (pointer) 30 is adjusted until inputs 25 and 27 are in sync.

Figure 3:
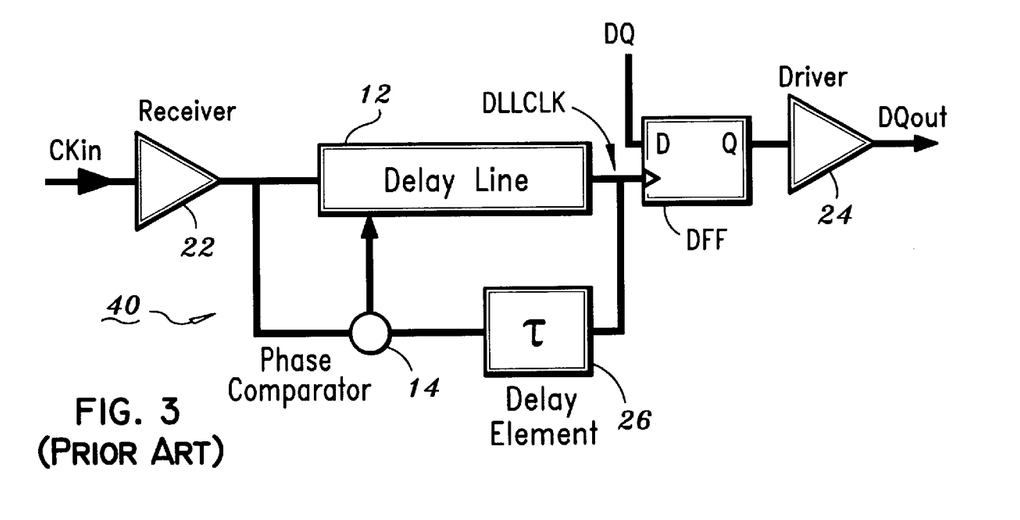
FIG. 3 is a schematic diagram of a prior art delay locked loop for providing a clock signal to a flip-flop for latching data.

Referring now to FIG. 3, a more specific use for a DLL is illustrated. A circuit 40 is employed to synchronize an output data stream DQout. Output data DQ is latched in a D Flip Flop (DFF) by a DLLCLK signal. The delay is the sum of receiver delay R, driver delay D and the delay introduced by Flip Flop DFF.

A frequency range for a delay locked loop (DLL) can be evaluated according to the following. A maximum frequency of a DLL corresponds to the minimum delay line delay $D_{min}$ associated with a smallest value of a pointer (30 in FIG. 3). $kT=R+D_{min}+D$ of $f_{max}=k/(R+D_{min}+D)$. High frequencies may be obtained by increasing the speed of receiver 22 and/or a data path by reducing $D_{min}$, the insertion delay of the delay line 12 or by synchronizing to a multiple of the period T. Operation at high frequency implies that the delay introduced by the delay line is small. This means the delay step should be chosen to be very small to reduce jitter.

The minimum frequency of the DLL corresponds to the maximum delay of delay line 12, $D_{max}$ associated with the highest value of the pointer. $kT=R+D_{max}+D$ or $f_{min}=k/(R+D_{max}+D)$.

For some purposes, low frequency operation is necessary. Joint Electron Device Engineering Council (JEDEC) requires devices to be operational at ½ the nominal frequency (See JC-42.3C Subcommittee on RAM Timing and Parametrics, Albuquerque, N. Mex., Jun. 3, 1998). For example, a 100 MHz chip should be able to run at 50 MHz. This requirement is in contradiction with the high frequency operation of the chip. For high frequency operation, the delay elements included in delay line 12 have to be very small so that minimum jitter is introduced by the delay line adjustment during chip operation. For low frequency operation, the delay introduced by delay line 12 has to be very high. Since the unit delay has to be very small, a very long delay line has to be used for this purpose. In the case of a digital DLL, more control bits are needed for the correct operation (more bits for the pointer signal). Also, more layout area for the delay line is needed on the chip. The JEDEC requirement for lower frequency operation is especially difficult to meet if the chip has devices (transistors) with short channel lengths. With short channel devices in the delay units, the unit delay of each delay line element is smaller which means that the total delay that can be introduced by the delay line will get smaller, which means that the minimum frequency of operation will increase.

Figure 4:
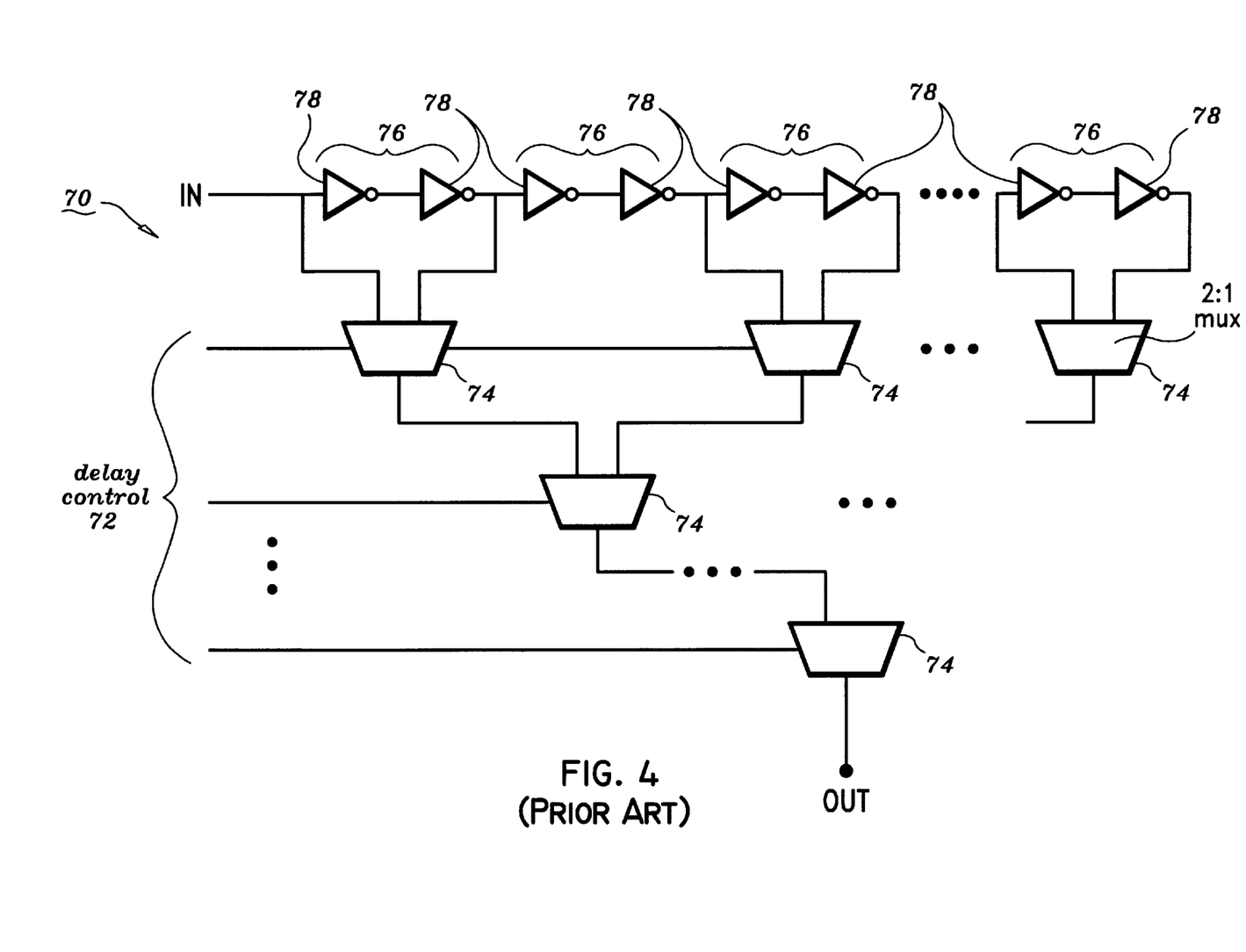
FIG. 4 is a schematic diagram of a prior art delay line circuit for providing a delay between input and output.

Referring to FIG. 4, a typical delay line circuit 70 is shown. Delay line 70 includes delay control lines 72 which input a digital word generated by phase comparator 14 (FIGS. 1–3). The digital word enables appropriate multiplexers 74 which are 2:1 multiplexers. Multiplexers 74 are arranged hierarchically according to the place value of the digital word. A delay line input (IN) receives a periodic signal, such as a clock signal and applies the signal to a plurality of delay units 76. Delay units 76 include a pair of invertors 78 for providing an appropriate delay to the input periodic signal. The invertors are powered by a constant voltage source. The number of delay units 76 employed in delay line 70 is set by multiplexers 74 which are activated by the digital word on control lines 72. The 2:1 multiplexers 74 complete a circuit from input (IN) to an output (OUT) through a predetermined number of inverter pairs to provide an appropriate delay such that the input and the output signals are substantially in sync.

Therefore, a need exists for a delay line which permits both high and low frequency operation by varying a supply voltage to delay elements of the delay line. A further need exists for a delay locked loop circuit which utilizes the delay line in integrated circuits.

SUMMARY OF THE INVENTION

A delay line, in accordance with the invention, includes a plurality of delay elements connecting an input and an output, the delay elements for causing a delay to be introduced to a signal passing through the delay elements. A voltage device is included for regulating power to the plurality of delay elements, the voltage device being adjustable to provide a predetermined voltage to the delay elements such that the delay in the delay elements is modified according to the predetermined voltage.

A delay locked loop, in accordance with the invention, includes a delay line connecting an input and an output, the delay line including a plurality of delay elements, the delay elements for causing a delay to be introduced to a signal passing through the delay elements. A phase comparator is connected to the input and coupled to the output for providing a control signal to the delay line such that the delay line provides a delay which synchronizes an output signal to an input signal. A voltage device is connected to the plurality of delay elements for regulating power to the plurality of delay elements, the voltage device being adjustable to provide a predetermined voltage to the delay elements such that the delay in the delay elements is modified according to the predetermined voltage.

A clock circuit includes an input node for receiving a delayed input signal from a receiver. A delayed locked loop has a delay line connecting to the input node and to an output node. The delay line includes a plurality of delay elements connecting between the input node and the output node, the delay elements for causing a delay to be introduced to a signal passing through the delay elements and a voltage device for regulating power to the plurality of delay elements, the voltage device being adjustable to provide a predetermined voltage to the delay elements such that the delay in the delay elements is modified according to the predetermined voltage. A phase comparator is coupled to the output node. The phase comparator provides a control signal for setting the delay of the delay line, the phase comparator also connects to the input node. A flip flop enabled by a clock from the delay line to permit data transfer through the flip flop to a driver is also included.

In alternate embodiments, the plurality of delay elements may each include a delay unit which may include a pair of serially connected invertors. The plurality of delay elements may be multiplexed according to a delay control signal such that an appropriate number of delay elements are activated according to the delay control signal. The voltage device preferably outputs a voltage according to the delay control signal. The voltage device preferably supplies at least two constant voltage levels. The delay line may be adjustable from an operating frequency to a testing frequency by adjusting the voltage device. The testing frequency may be about one half the operating frequency. The control signal may be digitally generated by the phase comparator. The delay locked loop may further include a delay element connecting between the output and the phase comparator.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to delay circuitry and more particularly, to an apparatus for trimming a frequency range for a data path using delay locked loop circuits which may be employed with down sort capability. The present invention provides a circuit for adjusting delay which employs a variable supply voltage. By altering a supply voltage to elements in a delay line, delay may be adjusted without altering the elements. Advantageously, the delay lines with variable voltage may be employed for high frequency applications for which they were originally designed as well as lower frequency application, such as chip testing.

Figure 5:
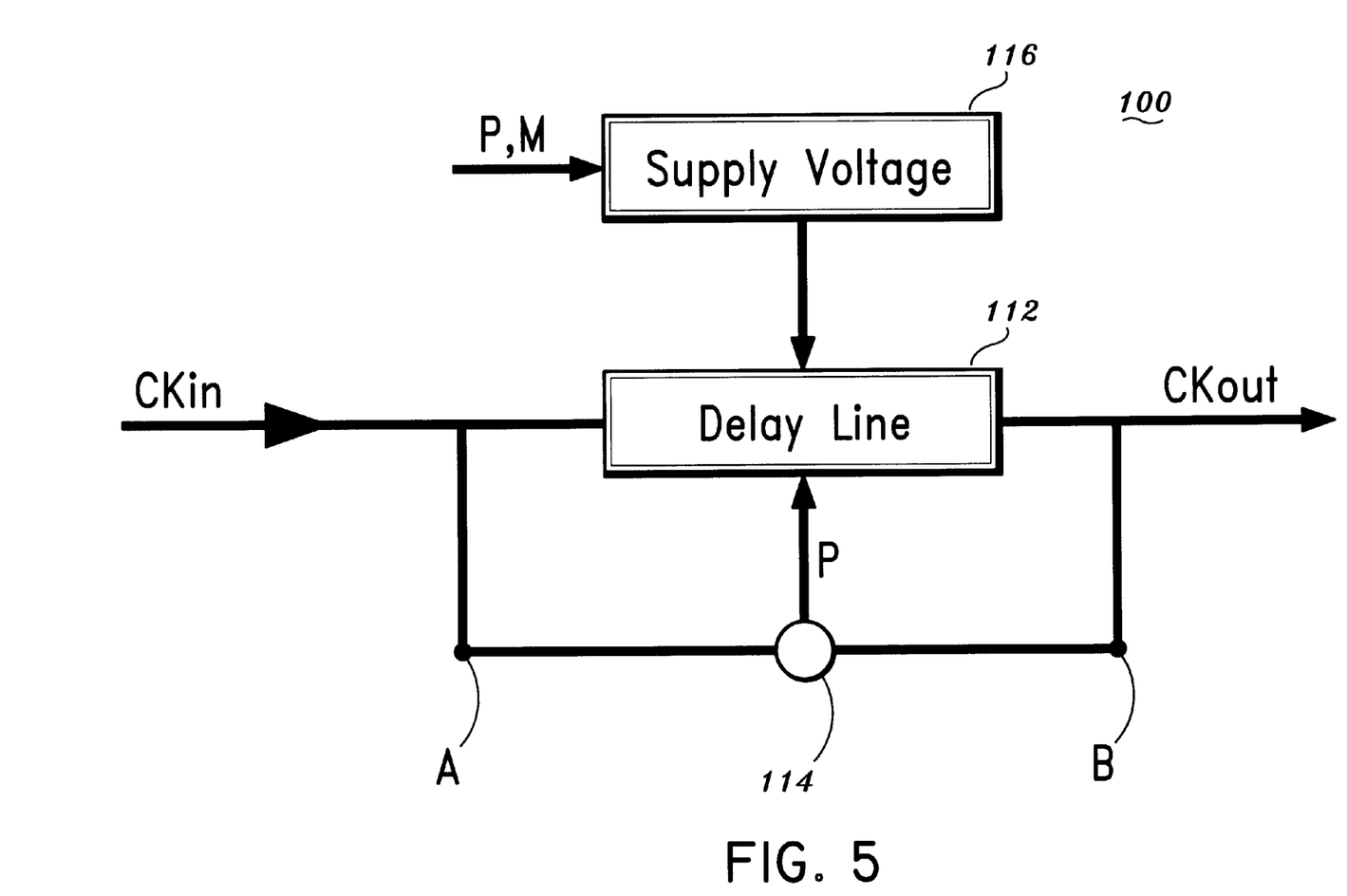
FIG. 5 is a schematic diagram of a delay locked loop with a voltage generator in accordance with the present invention.

Referring now in specific detail to the drawings in which like reference numerals identify similar or identical elements throughout the several views, and initially to FIG. 5, a delay locked loop (DLL) 100 in accordance with the present invention is shown. An input signal CKin is input to a delay line 112 and a phase comparator 114. Phase comparator 114 includes circuitry, for example logic circuitry, which analyzes nodes A and B to compare the periodic cycles thereon. An output signal CKout is compared with input signal CKin by employing phase comparator 114. Phase comparator 114 sets or adjusts delay line 112 to provide a zero phase difference between input and output signals. To perform this, the delay of delay line 112 is increased or decreased to synchronize delays between nodes A and B. Delay line 112 stabilizes when the delay between input CKin and output CKout signals reach a clock period T or a multiple thereof (kT, where k is a natural number). As shown in FIG. 5, a pointer P is generated by phase comparator 114 for controlling delay line 112. In accordance with the present invention, a supply voltage generator circuit 116 is employed to generate and adjust a supply voltage Vdd to delay elements of delay line 112. Voltage generator circuit 116 may include input lines 118 which receive the pointer signal P to adjust the supply voltage accordingly.

By employing voltage generator circuit 116, the present invention advantageously permits frequency range trimming for the circuit in which DLL 100 is utilized. The circuitry may advantageously be designed for high frequency applications, i.e., f=100 MHz or greater and still meet JEDEC specifications for example run at ½ f. By adjusting the supply voltage delay elements contribute greater or lessor amount of time delay inversely proportional to the supply voltage. In one embodiment, supply voltage generator 116 may be set to a first voltage for operation of an integrated circuit chip on which DLL 100 is formed, and a second voltage for testing the integrated circuit chip. In this embodiment, voltage generator 116 may include two or more discrete voltages which may be set by applying a control signal M. Alternately, variations is DLL 100 may be compensated for by providing pointer P to control the voltage output from voltage generator 116. Voltage generator 116 may provide different discrete voltages to different delay elements simultaneously or at different times. This may be implemented in the circuitry of voltage generator 116 or external to voltage generator 116.

Figure 6:
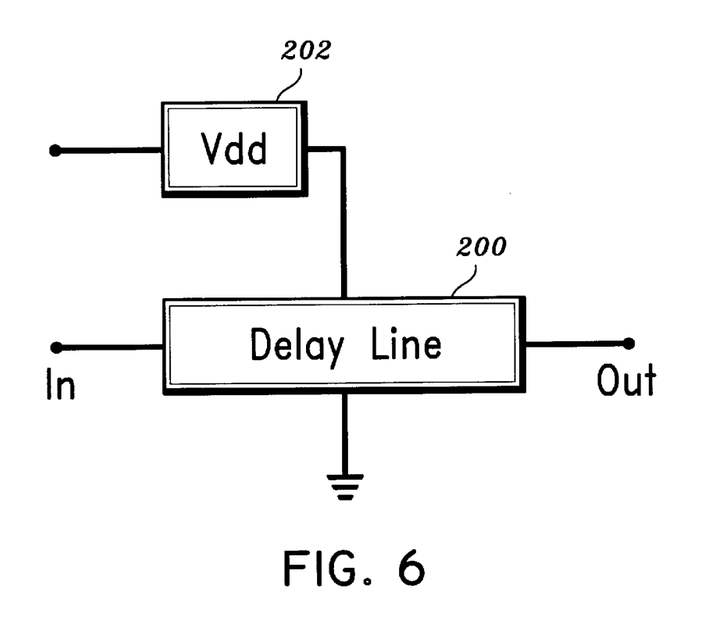
FIG. 6 is a schematic diagram of one embodiment of the present invention showing a delay line.
Figure 7:
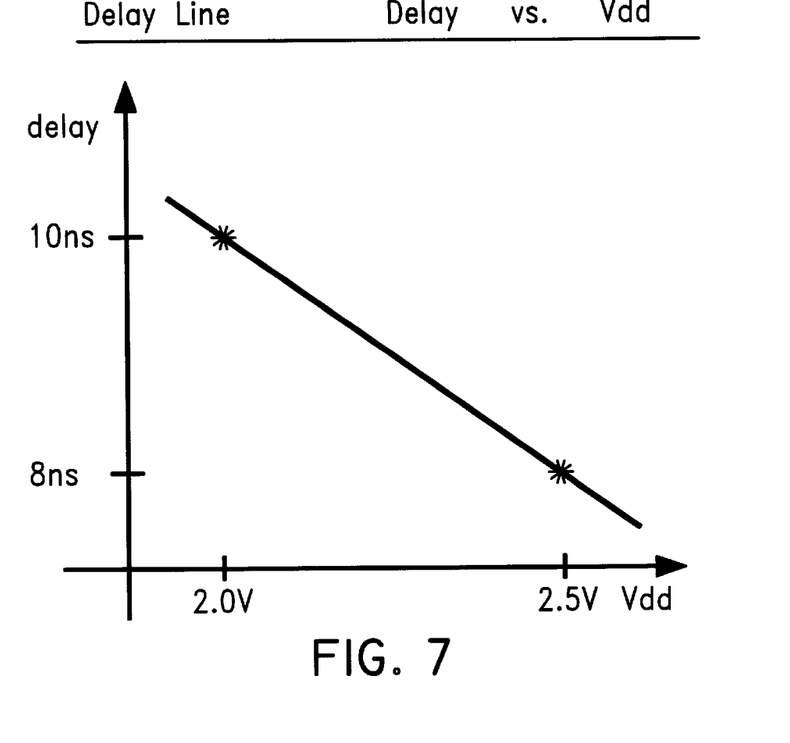
FIG. 7 is a plot of delay versus voltage from a voltage generator in accordance with the present invention.

Referring to FIGS. 6 and 7, FIG. 6 shows one embodiment of a delay line 200 in accordance with the present invention, and FIG. 7 shows an illustrative plot of delay versus supply voltage Vdd for delay line 200. Delay line 200 includes an input (IN) and an output (OUT) for respectively receiving and outputting a periodic signal, for example a clock signal. Delay line 200 may include a plurality of delay elements which may include gates such as invertors, although other gates or circuitry may be employed to provide delay in delay line 200. The gates of delay lines are powered by a supply voltage generator 202 which supplies Vdd. As shown in FIG. 7, as the supply voltage Vdd is increased the delay in delay line 200 is reduced. Although shown as a negative sloped linear relationship between delay in delay line 200 and supply voltage Vdd, other relationships between these parameters may be employed. Further, depending on the application of delay line 200, other ranges of supply voltage and delays may be employed. During operation of delay line 200, a control line, comparator, feedback loop or other devices may be employed to control supply voltage Vdd in accordance with the needed delay.

Figure 8:
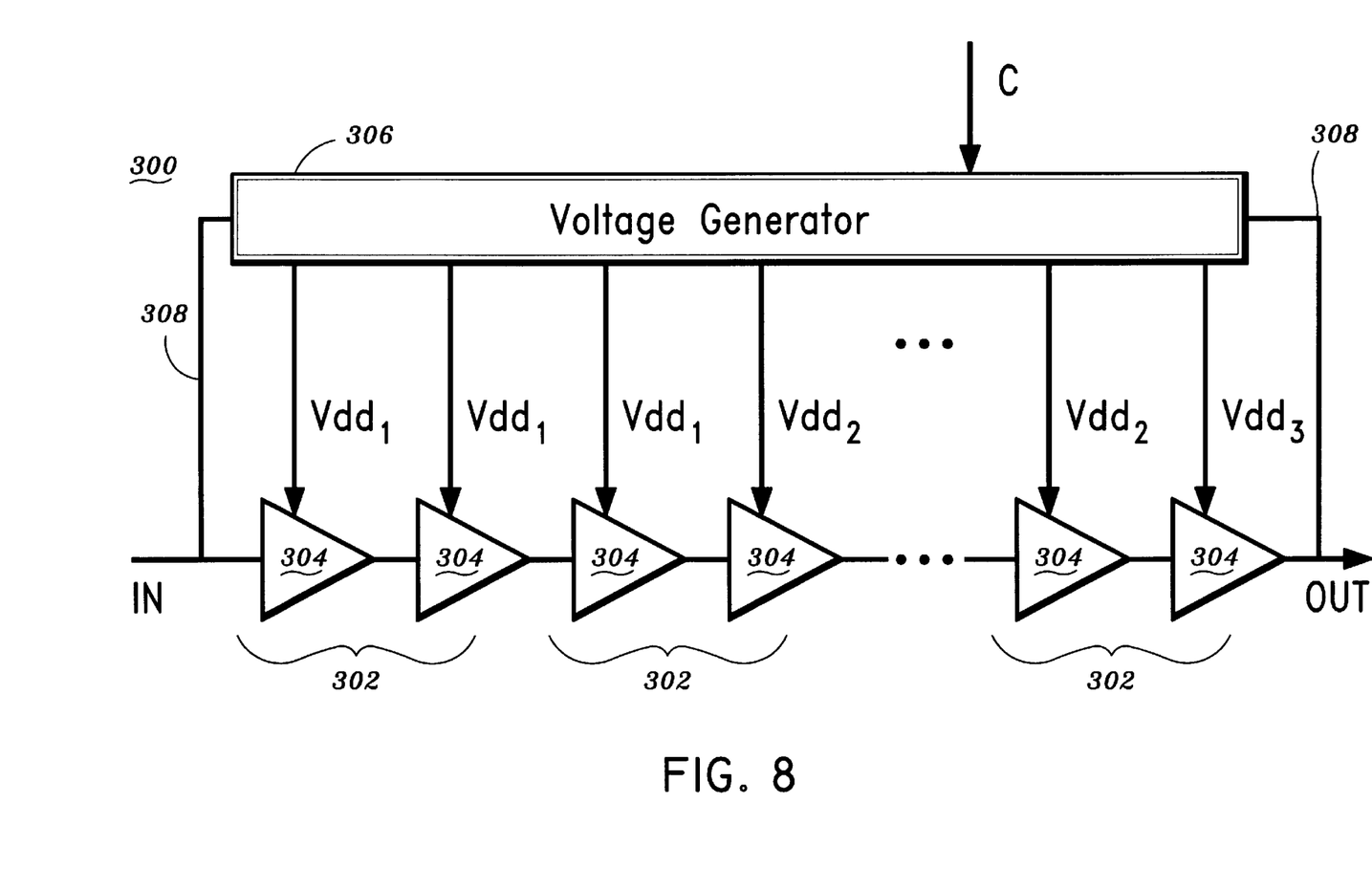
FIG. 8 is a schematic diagram of another embodiment of the present invention showing a delay line having delay elements and a voltage regulator.

Referring to FIG. 8, a delay line 300 for another embodiment of the present invention is shown. Delay line 300 includes a plurality of delay units 302. In a preferred embodiment delay units 302 includes a pair of serially connected invertors 304. Other delay units or circuits may be employed as well, such as simple RC circuits. A voltage generator circuit 306 is coupled to each inverter 304 to provide power thereto. In this embodiment, voltage generator 306 may be controlled by a phase comparator and/or a feedback loop 308 which analyzes a periodic input signal to a periodic output signal to provide a control signal to adjust supply voltage Vdd output from voltage generator. In another embodiment, a control signal C is included to adjust a supply voltage Vdd of voltage generator 306. Signal C may be a digital word having a value proportional to the supply voltage to be output. The digital word may be supplied by logic or other circuitry. In this way, delay may be adjusted through delay line 300 as described above. In another embodiment, the delay units 302 are individually controlled to achieve a desired delay in delay line 300. Voltage generator 306 may output a same supply voltage ($Vdd_1=Vdd_2=Vdd_3$) or different voltages $Vdd_1 \ne Vdd_2 \ne Vdd_3$ or combinations thereof depending on the design and the delay needed.

Figure 9:
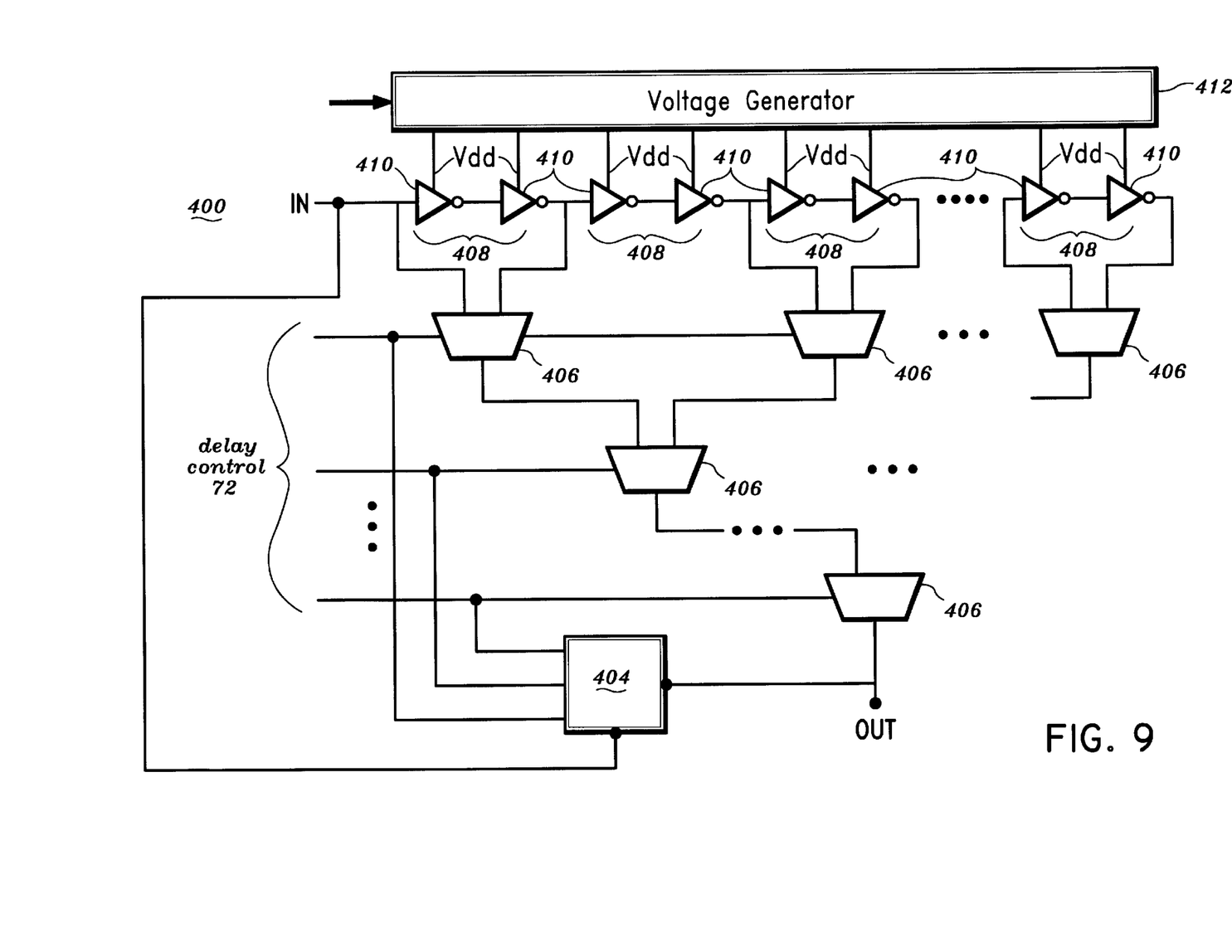
FIG. 9 is a schematic diagram of another embodiment of the present invention showing a delay line having delay elements and a voltage regulator, the delay elements being multiplexer and controlled by a control signal.

Referring to FIG. 9, another embodiment of the delay line in accordance with the present invention is shown. A delay line circuit 400 is shown. Delay line 400 includes delay control lines 402 which input a digital word generated by a phase comparator 404. The digital word enables appropriate multiplexers 406, for example, 2:1 multiplexers. Multiplexers 406 are arranged hierarchically according to the place value of the digital word. A delay line input (IN) receives a periodic signal, such as a clock signal and applies the signal to a plurality of delay units 408. Delay units 408 each preferably include a pair of invertors 410 for providing an appropriate delay to the input periodic signal. The number of delay units 408 employed in delay line 400 is set by multiplexers 406 which are activated by the digital word on control lines 402. The multiplexers 406 complete a circuit from input (IN) to an output (OUT) through a predetermined number of inverter pairs to provide an appropriate delay such that the input and the output signals are substantially in sync. In accordance with the invention, a supply voltage Vdd may be adjusted by a voltage generator 412 according to the delay control signal or in another embodiment Vdd may be set to a particular value to adjust delay line 400 for use with predetermined frequencies. For example, a first voltage is employed for Vdd for a first frequency and a second voltage is employed for Vdd for a second frequency, where the first frequency is the operating frequency and the second frequency is a slower frequency, for example about ½ the operating frequency. In one embodiment, the slower frequency may be used for testing or the integrated circuit may be sold as a slower device rated at the slower frequency, i.e., a chip that can operate at 100 MHz may be sold as a chip that runs at 60 MHz by employing the invention. By implementing the present invention $f_{max}$ and $f_{min}$ as described above with reference to FIG. 3 are afforded more margin since $D_{min}$ and $D_{max}$ may be reduced to improve operational frequency.

Figure 10:
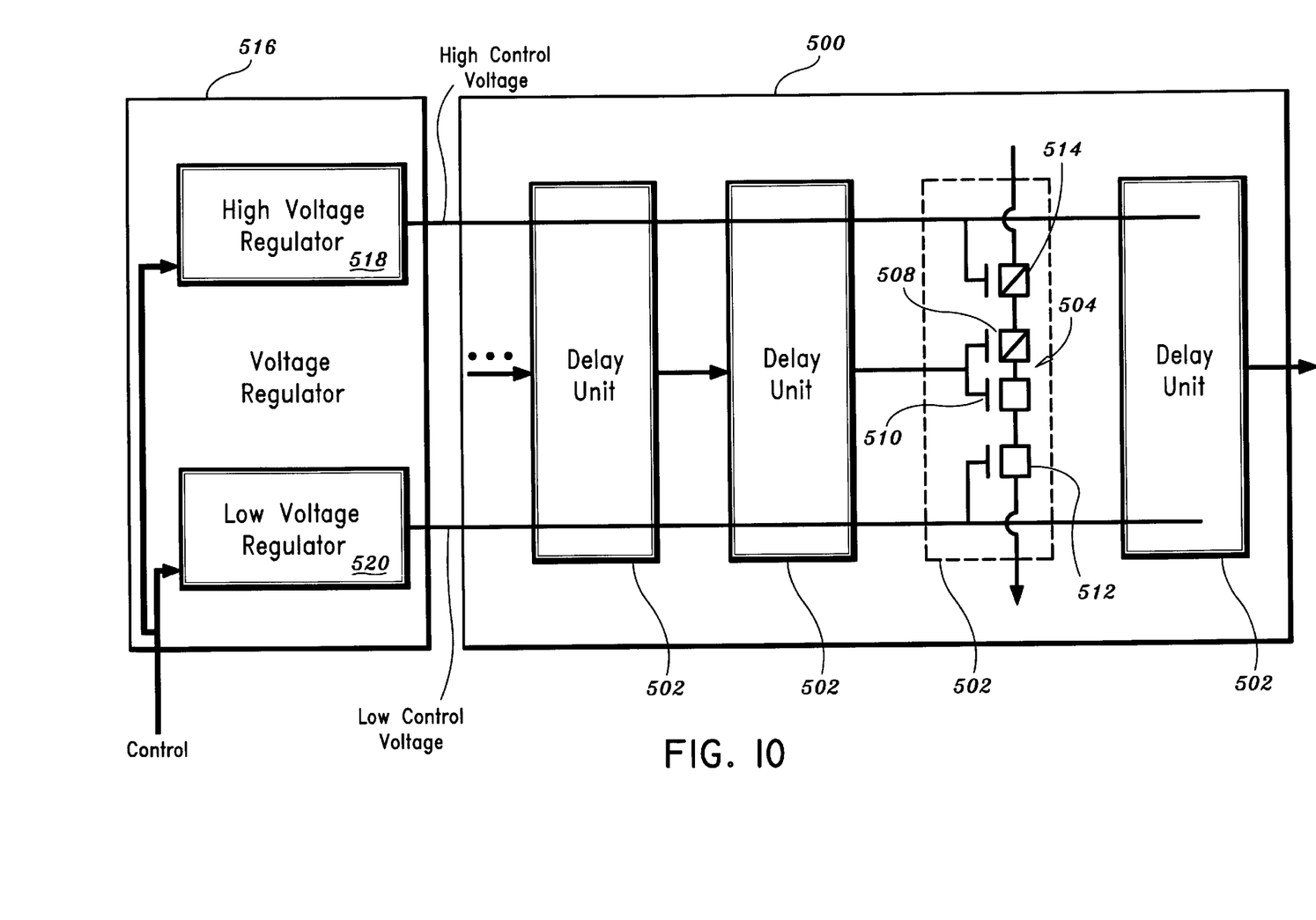
FIG. 10 is a schematic diagram of another embodiment of the present invention showing transistors for affecting the speed of an inverter to adjust delay in accordance with the present invention.

Referring to FIG. 10, another embodiment of the present invention is shown. A delay line circuit 500 includes a plurality of delay units 502. Each delay unit 502 preferably includes an inverter 504 which includes a P type field effect transistor (PFET) 508 and an N type field effect transistor (NFET) 510. In accordance with the present invention, an NFET 512 and a PFET 514 are included and connected serially (source to drain) with inverter 504. NFET 512 and PFET 514 are adjustably controlled by a voltage regulator circuit 516. Voltage regulator circuit 516 includes a high voltage regulator circuit 518 and a low voltage regulator circuit 520 which adjustably supply voltages to PFET 514 and NFET 512, respectively according to a control signal. The control signal may be supplied by a feedback loop or by an externally set mode or switch. In this way delay across delay line 500 is adjustably controlled by adjustably controlling the speed of inverter 504 using PFET 514 and NFET 512. By adjusting a high control and/or low control voltages from regulators 518 and 520, respectively, PFET 514 and NFET 512 have their resistances altered to provide more or less delay in invertor 504.

Other circuits may be employed. For example, instead of invertors for suppling delay, individual transistors may be used in which resistance is increased according to a gate signal. As more or less delay is needed a greater or less number of transistors would be activated. Other RC circuits may be employed as well.

Figure 11:
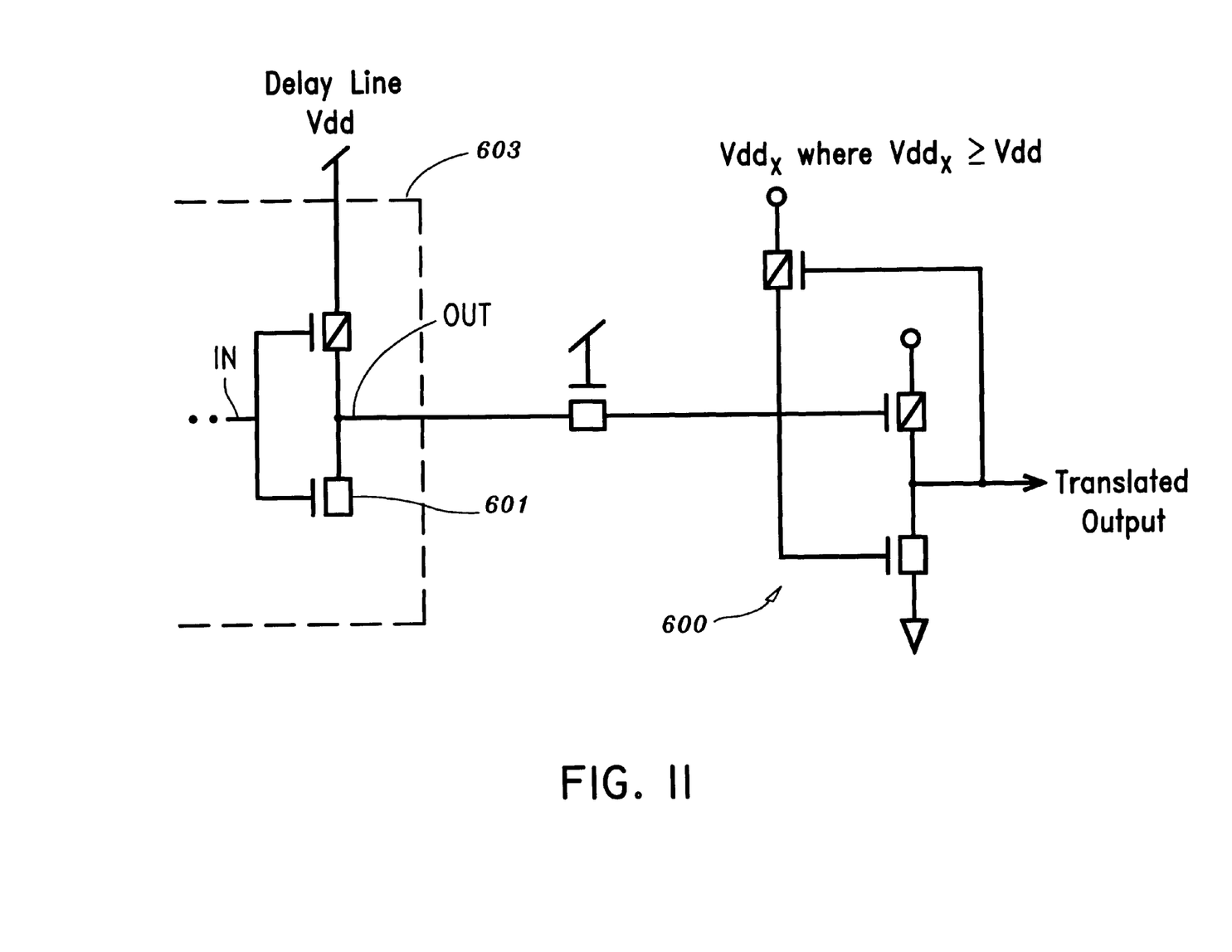
FIG. 11 is a schematic diagram of a translator circuit which may be employed to readjust an output of a delay line to make the output compatible with other circuits in accordance with the present invention.
Figure 12:
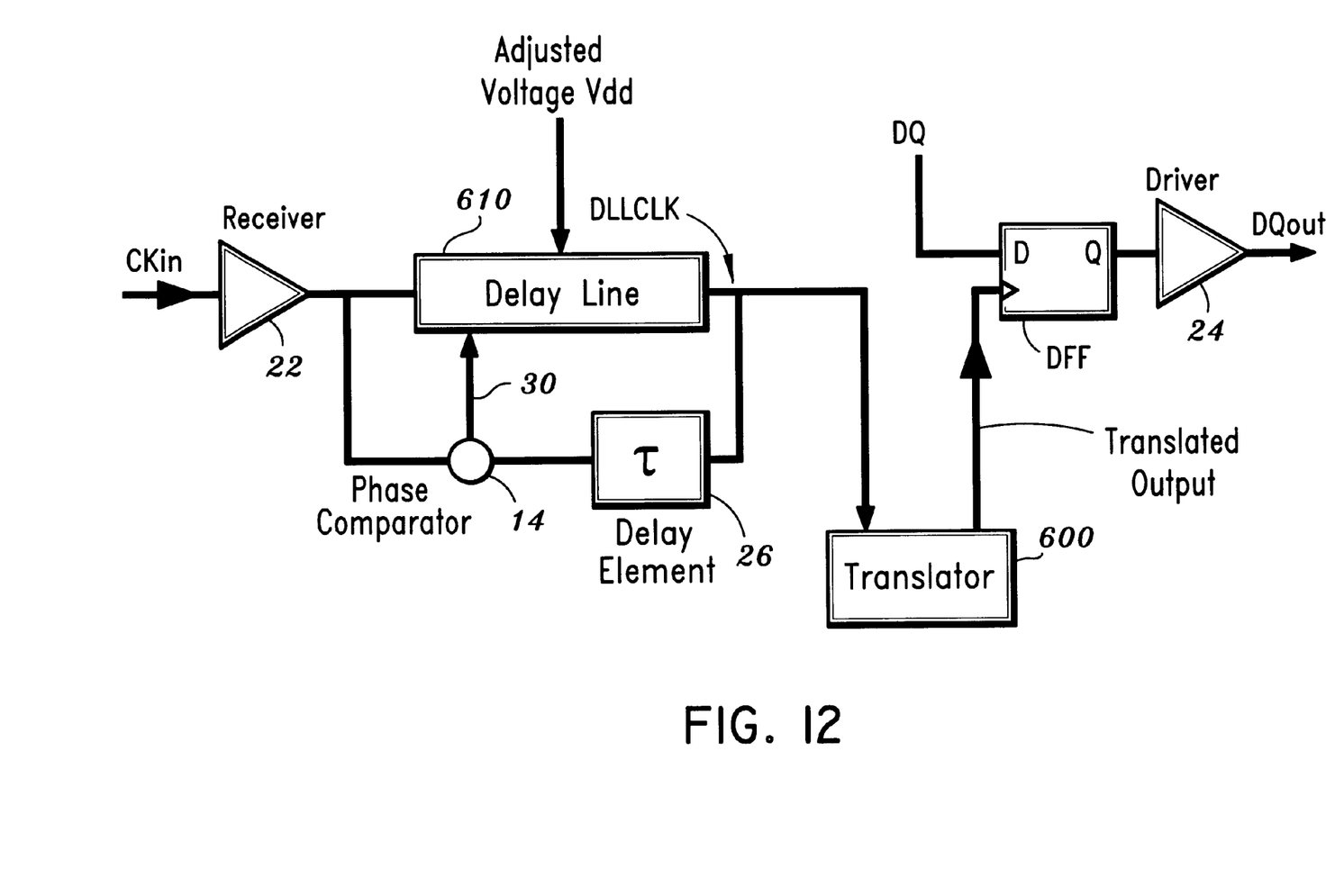
FIG. 12 is a schematic diagram showing the translator circuit of FIG. 11 in use in accordance with the present invention.

Referring to FIG. 11, in some cases, there may be a need to alter an output of an adjustable delay circuit to provide compatibility with other circuitry. As illustratively shown in FIG. 11, a translator circuit 600 may be employed, such as a level translator. Circuit 600 takes data output from delay elements 603 (one invertor 601 is shown) which use an adjusted supply voltage Vdd and readjusts the data using a supply voltage Vddx which is greater than or equal to the delay line supply voltage Vdd. In this way, translated output is generated which is compatible for use with other circuits. Referring to FIG. 12, a translator circuit 600 is employed between delay line 610 and flip-flop DFF to translate output from delay line 610 which is an adjusted delay in accordance with the invention to flip-flop DFF. The translated output is now compatible for use by flip-flop DFF.

Figure 13:
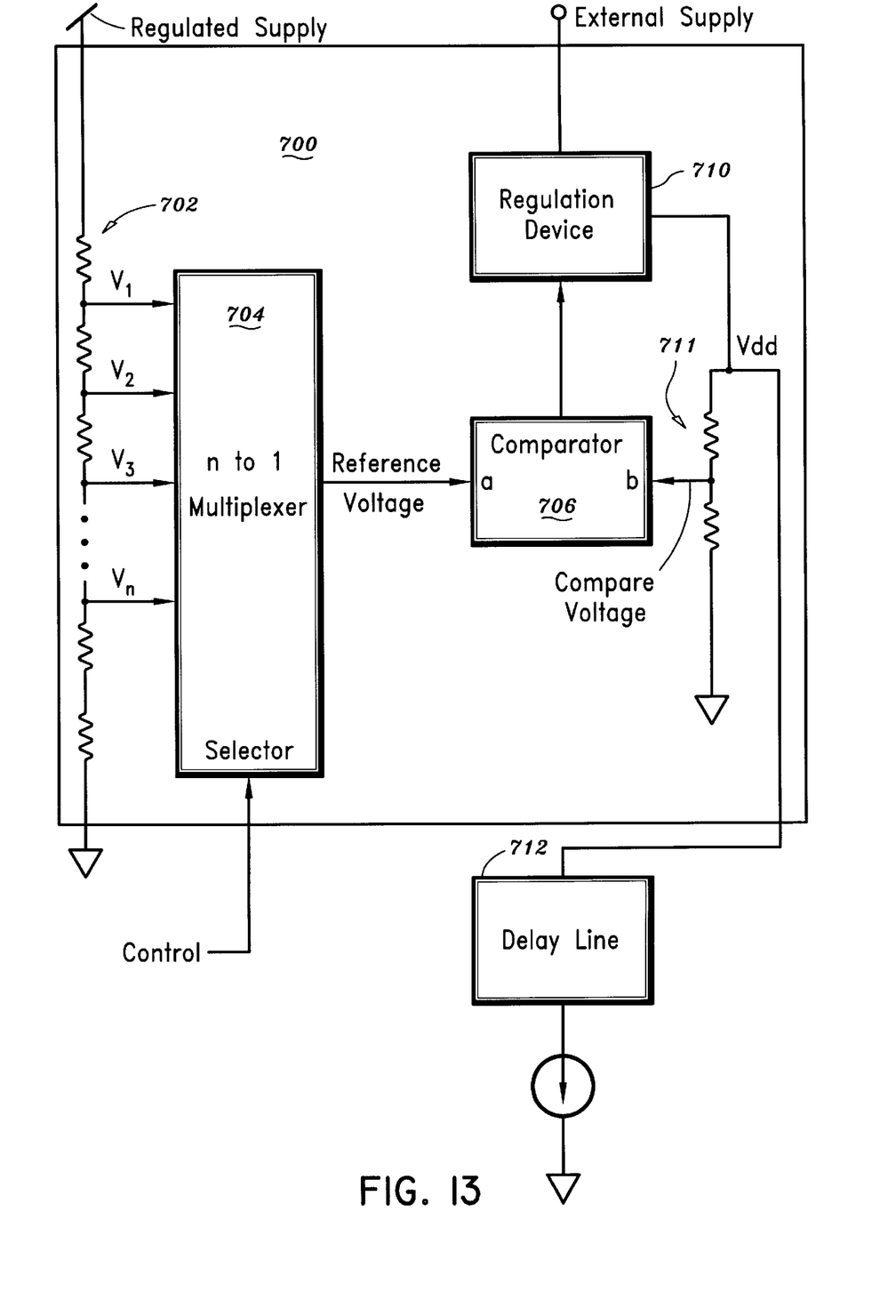
FIG. 13 is a schematic diagram of a regulator circuit for providing adjusted voltages in accordance with the present invention.

Referring to FIG. 13, a voltage regulator circuit 700 is shown which may be employed in accordance with the present invention. A voltage regulator or generator circuit 700 may be included in DLL 100 as a separate unit or a voltage generator circuit which may be employed to reduce noise in a DLL may be used to adjust the supply voltage to delay elements. Voltage generator circuit 700 includes a voltage divider 702 with n taps. Voltage divider 702 divides a regulated supply voltage into a set of reference voltages $v_1$ to $v_n$. An n to 1 multiplexer 704 selects one of the reference voltages and inputs the voltage to a reference voltage input, a, of a comparator 706. The reference voltage, a, is selected according to a control input signal input to multiplexer 704. Control input signal may be from a feedback loop, from a phase comparator (for example, phase comparator 404) or from an external source. A comparison or compare voltage is derived from the voltage supply for the delay line using another voltage divider 711 and is connected to the comparison input, b, of comparator 706. When comparator 706 senses that the reference voltage is greater than the comparison voltage, the output of comparator 706 turns a regulation device 710 on to supply current and increase the voltage, Vdd. A greater difference of the reference voltage above the comparison voltage will cause regulation device 710 to be turned on harder, supplying more current into Vdd. If the reference voltage is less than the comparison voltage, then regulation device is turned off by comparator 706 and no current flows into Vdd. In this way, the control inputs are made to adjust the voltage to a delay line 712 within a predetermined range.

The present invention has been described for an illustrative delay circuits. The present invention may be employed in many devices, preferably in integrated circuit devices. Such devices may include dynamic random access memories (DRAMs) and the like, processors or any other circuitry needing synchronization as a result of circuit delays. The present invention may be employed in the circuit shown in FIG. 3 and described above. With reference to FIG. 3, for high frequency operation, the delay elements included in delay line 12 would normally have to be very small so that minimum jitter is introduced by the delay line adjustment during chip operation. However, in accordance with the invention, to achieve lower operating or testing frequencies, the supply voltage to the delay elements may advantageously be adjusted thereby permitting larger delay units with increasing jitter and while providing sufficient delay. For low frequency operation, the delay introduced by delay line 12 normally has to be very high. Since the unit delay is normally very small, a very long delay line has to be used for this purpose. In the case of a digital DLL, more control bits are needed for the correct operation (more bits for the pointer signal). Also, more layout area for the delay line is needed on the chip. In accordance with the invention, by adjusting or trimming the supply voltage to the delay elements, the length of the delay line need not be increased nor does the layout area of the delay line need to be increased. The JEDEC requirement (as described above) for lower frequency operation is met by the present invention. Further, short channel length transistors may advantageously be compensated for by using the present invention. The short channel lengths contribute to increased chip speed and by employing the present invention the increased speed may be compensated for thereby permitting reduced frequency operation.

The present invention has now been described by way of example for an integrated circuit for a memory chip. However, the present invention is broader and may be employed in processors chips, embedded dynamic random access memories (DRAMs), application specific integrated circuits (ASICs) or other circuits which need delay compensation or tracking.

Having described preferred embodiments for a novel frequency range trimming for a delay line (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A delay line, comprising:
   a plurality of delay elements connecting an input and an output, the delay elements for causing a delay to be introduced to a signal passing through the delay elements; and
   a voltage device for regulating power to the plurality of delay elements, the voltage device concurrently distributing a plurality of voltages of different magnitude to different portions of the delay line to selectively modify delay through each of the delay elements in the same delay line such that the delay in the delay elements is modified according to the voltages of different magnitude, wherein the plurality of delay elements are multiplexed according to a delay control signal such that an appropriate number of delay elements are activated according to the delay control signal.

2. The delay line as recited in claim 1, wherein the plurality of delay elements each include a delay unit, the delay unit comprising a pair of serially connected invertors.

3. The delay line as recited in claim 1, wherein the voltage device outputs the voltages of different magnitude according to the delay control signal.

4. The delay line as recited in claim 1, wherein the voltages of different magnitude include at least two constant voltage levels.

5. The delay line as recited in claim 1, wherein the delay line is adjustable from an operating frequency to a lower frequency by adjusting the voltage device.

6. The delay line as recited in claim 5, wherein the lower frequency is about one half the operating frequency.

7. The delay line as recited in claim 1, further comprising a translator circuit coupled to the output of the delay line for adjusting data transmitted through the delay line to compensate for the voltages of different magnitude applied to the delay elements.

8. A delay locked loop, comprising:
   a delay line connecting an input and an output, the delay line including a plurality of delay elements, the delay elements for causing a delay to be introduced to a signal passing through the delay elements;
   a phase comparator connected to the input and coupled to the output for providing a control signal to the delay line such that the delay line provides a delay which synchronizes an output signal to an input signal; and
   a voltage device connecting to the plurality of delay elements for regulating power to the plurality of delay elements, the voltage device concurrently distributing a plurality of voltages of different magnitude to different portions of the delay line to selectively modify delay through each of the delay elements in the same delay line such that the delay in the delay elements is modified according to the voltages of different magnitude, wherein the plurality of delay elements are multiplexed according to the control signal such that an appropriate number of delay elements are activated according to the control signal.

9. The delay locked loop as recited in claim 8, wherein the plurality of delay elements each include a delay unit, the delay unit comprising a pair of serially connected invertors.

10. The delay locked loop as recited in claim 8, wherein the voltage device outputs the voltages of different magnitude according to the control signal.

11. The delay locked loop as recited in claim 8, wherein the voltages of different magnitude include at least two constant voltage levels.

12. The delay locked loop as recited in claim 8, wherein the control signal is digitally generated by the phase comparator.

13. The delay locked loop as recited in claim 8, further comprises a delay element connecting between the output and the phase comparator.

14. The delay locked loop as recited in claim 8, wherein the delay line is adjustable from an operating frequency to a lower frequency by adjusting the voltage device.

15. The delay locked loop as recited in claim 14, wherein the lower frequency is about one half the operating frequency.

16. The delay locked loop as recited in claim 8, further comprising a translator circuit coupled to the output of the delay line for adjusting data transmitted through the delay line to compensate for the voltages of different magnitude applied to the delay elements.

17. A clock circuit, comprising:
   an input node for receiving a delayed input signal from a receiver;
   a delayed locked loop having a delay line connecting to the input node and to an output node, the delay line including:
      a plurality of delay elements connecting between the input node and the output node, the delay elements for causing a delay to be introduced to a signal passing through the delay elements; and
      a voltage device for regulating power to the plurality of delay elements, the voltage device concurrently distributing a plurality of voltages of different magnitude to different portions of the delay line to selectively modify delay through each of the delay elements in the same delay line such that the delay in the delay elements is modified according to the voltages of different magnitude, wherein the plurality of delay elements are multiplexed according to the control signal such that an appropriate number of delay elements are activated according to the control signal;
   a phase comparator coupling to the output node, the phase comparator for providing a control signal for setting the delay of the delay line, the phase comparator connecting to the input node; and
   a flip flop enabled by a clock rate output from the delay line to permit data transfer through the flip flop to a driver.

18. The clock circuit as recited in claim 17, wherein the plurality of delay elements each include a delay unit, the delay unit comprising a pair of serially connected invertors.

19. The clock circuit as recited in claim 17, wherein the voltage device outputs a voltage according to the control signal.

20. The clock circuit as recited in claim 17, wherein the voltages of different magnitude include at least two constant voltage levels.

21. The clock circuit as recited in claim 17, wherein the control signal is digitally generated by the phase comparator.

22. The clock circuit as recited in claim 17, wherein the delay line is adjustable from an operating frequency to a lower frequency by adjusting the voltage device.

23. The clock circuit as recited in claim 22, wherein the lower frequency is about one half the operating frequency.

24. The clock circuit as recited in claim 17, further comprising a translator circuit coupled to the output of the delay line for adjusting data transmitted through the delay line to compensate for the voltages of different magnitude applied to the delay elements.

* * * * *